(12) United States Patent
Miller et al.

(10) Patent No.: US 11,847,813 B2
(45) Date of Patent: Dec. 19, 2023

(54) ARTIFICIAL INTELLIGENCE-ENABLED PREPARATION END-POINTING

(71) Applicant: FEI Company, Hillsboro, OR (US)

(72) Inventors: Thomas Gary Miller, Portland, OR (US); John F. Flanagan, IV, Hillsboro, OR (US); Brian Routh, Jr., Beaverton, OR (US); Richard Young, Beaverton, OR (US); Brad Larson, Portland, OR (US); Aditee Shrotre, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/499,603

(22) Filed: Oct. 12, 2021

(65) Prior Publication Data

US 2022/0067915 A1 Mar. 3, 2022

Related U.S. Application Data

(63) Continuation of application No. 16/409,477, filed on May 10, 2019, now Pat. No. 11,176,656.

(51) Int. Cl.
*G06N 3/00* (2023.01)
*G06N 20/00* (2019.01)
(Continued)

(52) U.S. Cl.
CPC ........ *G06V 10/454* (2022.01); *G06F 18/2115* (2023.01); *G06F 18/2163* (2023.01);
(Continued)

(58) Field of Classification Search
CPC ..... H01L 22/26; H01L 22/12; H01L 21/2633; H01L 21/2686; H01J 37/147; H01J 37/222; H01J 37/28; H01J 37/3053; G06K 9/6231; G06K 9/6261; G06T 2207/10056; G06T 2207/30148; G06T 2207/20084
See application file for complete search history.

(56) References Cited

U.S. PATENT DOCUMENTS 9,837,246 B1 * 12/2017 Geurts .................. H01J 37/317
9,905,394 B1 * 2/2018 Bhattiprolu ........... H01J 37/265
(Continued)

FOREIGN PATENT DOCUMENTS

| JP | 2018-152330 | 9/2018 |
|---|---|---|
| KR | 10-2017-0066311 | 6/2017 |

OTHER PUBLICATIONS

English Translation of South Korean Office Action dated Dec. 2, 2022 in corresponding South Korean Application No. 10-2020-0019345.

*Primary Examiner* — Omar F Mojaddedi
(74) *Attorney, Agent, or Firm* — MICHAEL BEST & FRIEDRICH LLP

(57) ABSTRACT

Methods and systems for implementing artificial intelligence enabled preparation end-pointing are disclosed. An example method at least includes obtaining an image of a surface of a sample, the sample including a plurality of features, analyzing the image to determine whether an end point has been reached, the end point based on a feature of interest out of the plurality of features observable in the image, and based on the end point not being reached, removing a layer of material from the surface of the sample.

22 Claims, 5 Drawing Sheets

(51) Int. Cl.
  *G06T 7/00*      (2017.01)
  *G06V 10/764*    (2022.01)
  *G06V 10/44*     (2022.01)
  *H01L 21/66*     (2006.01)
  *H01L 21/268*    (2006.01)
  *H01L 21/263*    (2006.01)
  *G06F 18/24*     (2023.01)
  *G06F 18/2115*   (2023.01)
  *G06F 18/21*     (2023.01)

(52) U.S. Cl.
  CPC ............ *G06F 18/24* (2023.01); *G06T 7/0004* (2013.01); *G06V 10/764* (2022.01); *H01L 21/2633* (2013.01); *H01L 21/2686* (2013.01); *H01L 22/26* (2013.01); *G06T 2207/10056* (2013.01); *G06T 2207/20081* (2013.01); *G06T 2207/20084* (2013.01); *G06T 2207/30148* (2013.01); *G06V 2201/06* (2022.01)

(56) References Cited

U.S. PATENT DOCUMENTS

| | | | | |
|---|---|---|---|---|
| 2014/0061032 A1* | 3/2014 | Miller | ............... | G01N 1/32 |
| | | | | 204/298.36 |
| 2015/0221092 A1* | 8/2015 | Mega | ............... | G06T 7/001 |
| | | | | 382/103 |
| 2018/0015571 A1* | 1/2018 | Wang | ............... | G06T 7/136 |
| 2020/0117739 A1* | 4/2020 | Bulut | ............... | G06N 3/0427 |

* cited by examiner

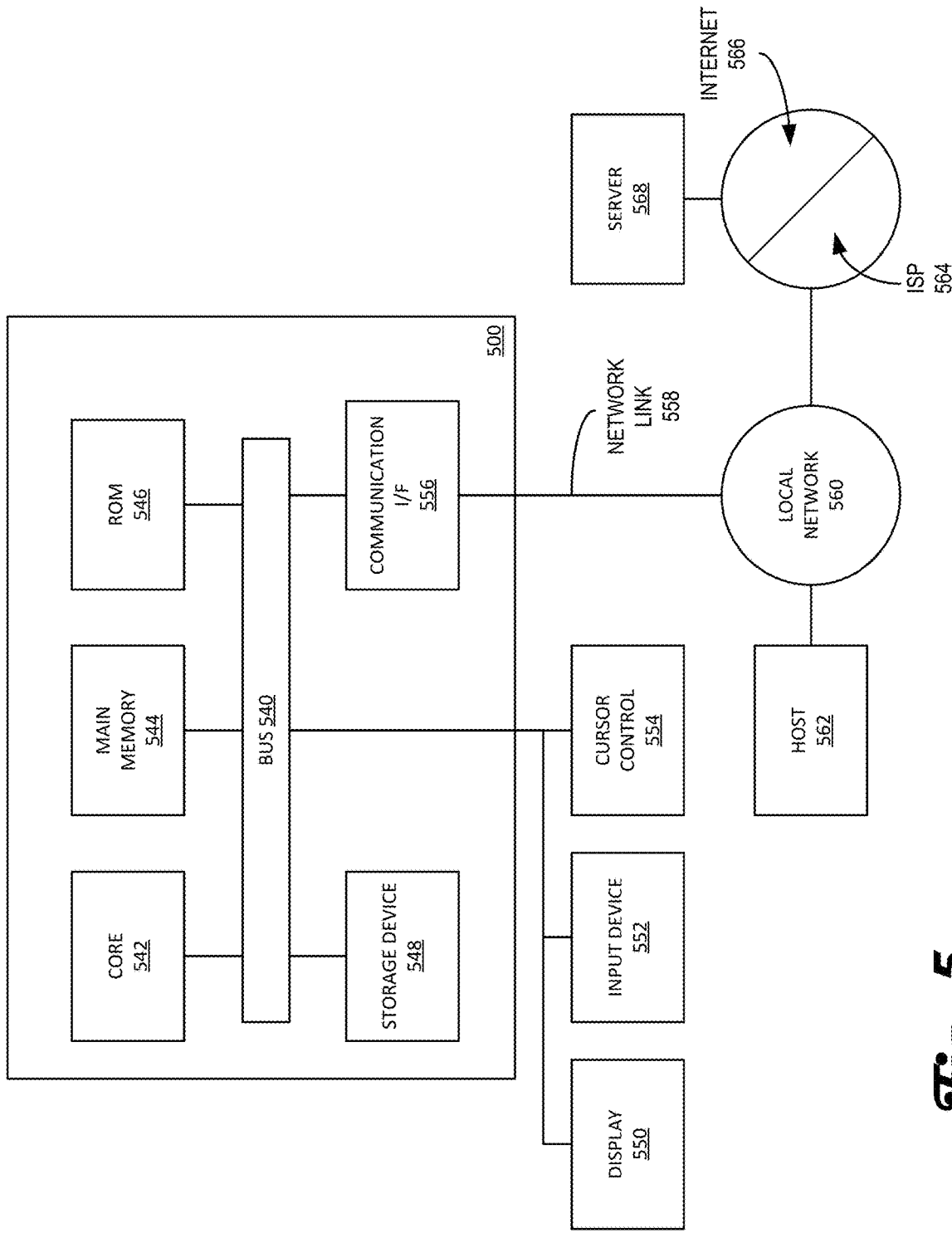

ARTIFICIAL INTELLIGENCE-ENABLED PREPARATION END-POINTING

This application is a Continuation of U.S. application Ser. No. 16/409,477 filed May 10, 2019, which claims priority from U.S. Provisional Application No. 62/812,168, filed Feb. 28, 2019, both of which are hereby incorporated by reference.

FIELD OF THE INVENTION

The invention relates generally to artificial intelligence (AI) enabled process control, and specifically to AI enabled preparation end-pointing for use in sample preparation in charged particle microscopy.

BACKGROUND OF THE INVENTION

In many areas of industry and research, analysis and measurement of small structures is performed for product/ process development, quality control, medical evaluation, etc. Such analysis and measurement may be performed using various types of inspection tools, which likely include forming images of one or more structures of interest. For example, in the semiconductor industry, charged particle microscopes are used to image circuit structures on the nanometer scale, which typically become the basis for the analysis and measurement tasks. In such an example, before measurements are performed, images of the circuit structures in question need to be obtained from portions of the wafer or chip where the circuit elements are located, which need to be removed. Such removal, however, typically requires a highly skilled operator to determine where to remove the portion that includes the features of interest. After removal of the portion, the portion may typically undergo additional processing, e.g., thinning, to ensure the desired circuit structures are visible for subsequent imaging, e.g., transmission electron microscopy. While some of this process may be automated, the additional processing is difficult to automate due to the variations in circuit structure shapes and layout, which make conventional pattern recognition unreliable if not unfit for the technique.

Although many attempts have been made to streamline and/or automate such processes over the years, these attempts have typically failed to provide the desired results and the use of highly skilled technicians remains a constant. As such, more robust automated control of the at least the additional processing to form these imaging structures, e.g., lamella, are desired.

SUMMARY

Methods and systems for implementing artificial intelligence enabled preparation end-pointing are disclosed. An example method at least includes obtaining an image of a surface of a sample, the sample including a plurality of features, analyzing the image to determine whether an end point has been reached, the end point based on a feature of interest out of the plurality of features observable in the image, and based on the end point not being reached, removing a layer of material from the surface of the sample.

An example system may be a charged particle microscope that at least includes an ion column to provide a focused ion beam, an electron column to provide an electron beam, and a controller. The controller may either include code or be coupled to memory that includes code that, when executed by the controller, causes the charged particle microscope to obtain an image of a surface of a sample, the sample including a plurality of features, analyze the image to determine whether an end point has been reached, the end point based on a feature of interest out of the plurality of features observable in the image, based on the end point not being reached, milling, by the focused ion beam, the surface of the sample to remove a layer of material; and based on the end point being reached, cease material removal.

BRIEF DESCRIPTION OF THE DRAWINGS

FIG. 5 is an example functional block diagram of a computing system upon which an embodiment of the invention may be implemented.

Like reference numerals refer to corresponding parts throughout the several views of the drawings.

DETAILED DESCRIPTION OF EMBODIMENTS

Figure 1:
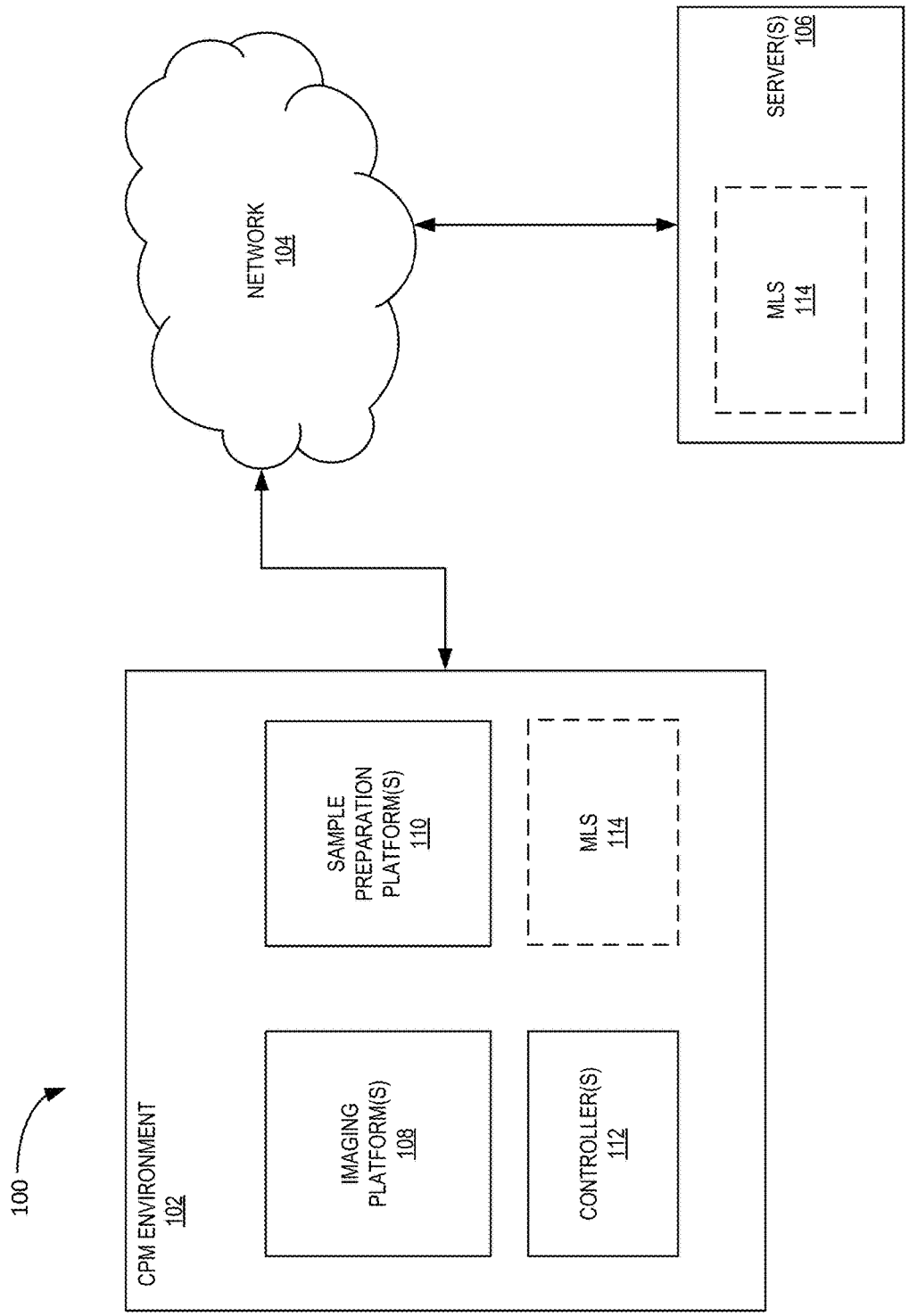
FIG. 1 is an example of a charged particle microscope system in accordance with an embodiment of the present disclosure.

Embodiments of the present invention relate to AI-enhanced end point detection. In some examples, the AI aspect assists in determining when a desired processing end point has been reached, which may be based on a structure viewable in an image. For example, a surface of a sample is milled to remove a layer of material, the surface is then imaged and the image is analyzed by a neural network to determine if the structure indicates an end point to the milling process. If the neural network determines the structure is indicative of the end point, the process ends, else the milling process may be repeated. However, it should be understood that the methods described herein are generally applicable to a wide range of different AI enhanced metrology, and should not be considered limiting.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Additionally, in the following discussion and in the claims, the terms "including" and "comprising" are used in an open-ended fashion, and thus should be interpreted to mean "including, but not limited to . . . ." The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, separated from a wafer, or packaged for use on a circuit board. The term "FIB" or "focused ion beam" is used herein to refer to any collimated ion beam, including a beam focused by ion optics and shaped ion beams, and may also mean a charged particle microscope containing hardware to produce a focused ion beam.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In general, various industries and research areas perform analysis on micro- or nano-sized features held in micro- or nano-sized samples. The analysis typically includes imaging of the features. The features, for example, can be structures formed during prior process steps or defects in the sample. To image such small features, thin samples may be formed from a bulk material where the sample structure includes one or more features of interest. These samples may be referred to as lamellae. In general, such lamella are formed out of samples to view buried structures using various charged particle microscope techniques. For example, in the semiconductor industry, lamellae may be formed from a processed wafer or an integrated circuit to view what may be process and/or design defects. While many examples used herein refer to the semiconductor industry and/or integrated circuit elements, the disclosed techniques may be implemented in any industry that use image analysis to determine end points for terminating processes. The end point determinations disclosed herein use trained artificial neural networks (ANNs) and/or machine learning systems/algorithms, more generally, to analyze micrographs, e.g., charged particle images, when determining whether an end point has been reached. In some embodiments, the implemented ANN may be partially trained on available data before undergoing additional training using end-user-specific proprietary information. In other embodiments, the ANN may be implemented without the additional training based on the available information. The use of AI, e.g., machine learning systems or neural networks, may advance automation of lamella creation freeing up highly skilled technicians from manually monitoring the formation of lamella and further increasing the speed at which industries may evaluate the desired features in the lamella. In general, the techniques disclosed herein to address the issues previously encountered at least include controlling termination of material removal based on real-time machine learned feedback based on (customer specific) training of a neural network.

Once trained, the ANN or machine learning algorithm, may assist with determining when to terminate a process based on features viewable in an image, e.g., charged particle micrograph. The termination is based on a defined end point. As used herein, the term "end point" refers to a location within a sample, e.g., lamella, that termination of a current process is desired. In some examples, the end point may also be an initial starting point for a subsequent process. For example, an initial milling step of a sample may be performed at a high beam energy and an associated end point may be selected to prevent sample damage past a desired location. Upon end pointing the high beam energy process, a subsequent milling process at a lower beam energy may be performed to remove any damage and to mill to a new end point location. Additionally, the end point may be a location to stop milling so that a desired feature to image is located at a central location of a thin lamella, e.g., ~15 nm in thickness. Thin lamellas may then be used to obtain TEM images of the desired feature within the lamella. In line with the semiconductor industry examples, the desired feature may be a source, a drain or a gate of a transistor, such as a finFET transistor or a Gate All Around type transistor. In other embodiments may include circuit structures included in VNAND, DRAM, and other memory-type samples, such circuit structures may be capacitors, conductors, conductive traces and vias, and the like.

In the disclosed solution, the ANN or machine learning system/algorithm is used to both analyze images and to provide feedback for charged particle microscope control. The aim of the analysis and feedback is to provide additional or full automation of lamella preparation processes, which can be timely and technician intensive without the aid of artificial intelligence assistance. For example, if the desired feature for analysis is a source of a specific finFET, the technician needs to know what the source should look like in a scanning electron microscope (SEM) micrograph, for example, and further be able to know what finFET out of many finFETs to target. Such determination with traditional pattern recognition software is extremely difficult, if not impossible, due to the variations in source shapes, numbers of transistors (e.g., other finFETs) in close proximity to the finFET of interest, and variations in metal interconnects above the finFET of interest. The cumulation and permutations of these variations are difficult for pattern recognition software to interpret, and are also difficult for highly trained technicians and scientists. These variables, however, are why AI-based analytical systems are ideal for implementation. The AI-based systems are able to perform in the face of unaccounted for variations and may lead to fully automated lamella preparation, for example.

FIG. 1 is an example of a charged particle microscope system 100 in accordance with an embodiment of the present disclosure. The charged particle microscope (CPM) system 100, or simply system 100, at least includes a CPM environment 102, a network 104, one or more servers 106, and a machine learning system 114. The CPM system 100 may be used to investigate and analyze samples of various size and makeup. For example, the CPM system 100 may be implemented, at least partially, at an integrated circuit manufacturing site and used to analyze and measure various aspects of wafers and circuits fabricated at the site. In some embodiments, the CPM system 100 may be distributed across various locations. For example, the CPM environment 102 may be located at a fabrication or development location, the network 104 distributed locally, regionally, or nationally, and the server 106 located at a server farm and coupled to the CPM environment 100 via the network 104.

Regardless of the organization of the CPM system 100, the system 100 may at least be used to implement one or more machine learning systems (MLS) 114 along with one or more material removal techniques included in one or more charged particle microscopes for the formation of lamella, where the MLS 114 determines when to terminate one or more material removal processes based on detection of a defined end point.

The CPM environment 102 includes any type of charged particle microscope, but the application of the neural network and analytics disclosed herein is not limited to charged particle microscopy, which is used for illustrative purposes only. Example CPMs include scanning electron microscopes (SEMs), transmission electron microscopes (TEMs), scanning transmission electron microscopes (STEMs), focused ion beams (FIBs), dual beam (DB) systems that include both electron and ion beam capabilities, and triple beam systems that include electron beam and ion beam capabilities along with at least one laser, to name a few. The CPM environment 102 may be used to obtain electron or ion images of samples, some of which may be thin sections, e.g., lamellae, taken from a larger sample or wafer. The CPM environment 102 may include various aspects that can be contained in a single tool or that may be situated in separate tools. For example, the CPM environment 102 may include an imaging platform 108, e.g., an SEM, TEM, or STEM, a sample preparation platform 110, and one or more controllers 112. The sample preparation platform 110 may include a DB system that both images and processes, e.g., etches or mills, the sample. Of course, each platform 108 and 110 may include more than one microscope/sample preparation tools as well.

The imaging platform 108 is used to obtain images of samples, some of the samples may have been prepared by the sample prep platform 110, but that is not necessary. The images are obtained using an electron and/or ion source to irradiate the sample with a respective beam of charged particles. In some examples, the charged particle beam imaging is obtained by a scanned beam, e.g., moved across the sample, while other examples the charged particle beam is not scanned. Backscattered, secondary, or transmitted electrons, for example, are then detected and gray scale images formed based thereon. The images include gray scale contrast depending on the materials of the sample, where the changes in gray scale indicate changes in the material type or crystal orientation. Additionally or alternatively, the imaging may include non-gray scale techniques, e.g., EELS, EDS, EBSD, pixelated detectors, that would allow for feature contrast through one or more of these imaging techniques. The imaging platform 108 may be controlled by internal controls (not shown), controller 112, or a combination thereof.

The sample prep platform 110 forms samples to be imaged by the imaging platform 108. The sample prep platform 110 may be a DB system that uses a FIB to prepare and assist in the removal of a thin sample, e.g., a lamella, from a larger sample, such as by ion milling, ion induced etching, or a combination thereof, and other processes to process the sample for imaging. Other processes may include, but are not limited to, planarizing mills/etches, fiducial generation, cross-section formation, top-down lamella preparation, gas-assisted etching/deposition, etc. The sample prep platform 110 also includes an electron imaging component that allows the sample prep process to be monitored, but the electron imaging component is not required. In some embodiments, the sample prep platform 110 may include other physical preparation aspects—lasers, cutting tools (e.g., knife edges, microtomes, etc.), resin encapsulation tools, cryogenic tools, etc.—that are used to prepare the sample for the imaging platform 108. The sample prep platform 110 may be controlled by internal controls (not shown), controller 112, or a combination thereof in response to end point determinations performed by the MLS 114.

The network 104 may be any kind of network for transmitting signals between the CPM environment 102 and the server(s) 106. For example, the network 104 may be a local area network, a large area network, or a distributive network, such as the internet, a telephony backbone, and combinations thereof.

The servers 106 may include one or more computing platforms, virtual and/or physical, that can run code for various algorithms, neural networks, and analytical suites. While not shown, a user of the CPM environment 102 may have access to the servers 106 for retrieval of data, updating software code, performing analytical tasks on data, etc., where the access is through the network 104 from the user's local computing environment (not shown). In some embodiments, the user accesses image data stored on the servers 106, implements segmentation using the ANN 114 (which may be executed on the servers 106 or the CPM Environment 102), and performs metrology at their local computing environment.

In operation, a bulk sample, such as a processed wafer or an integrated chip (IC), may be provided to the sample preparation platform 110. Initially, the sample preparation platform 110 may form and extract a chunk from the wafer/IC. The chunk may be thicker than a final lamella, which will be used for imaging one or more features of interest. For example, the chunk may be around 100 nm thick while a final lamella may be around 15 to 25 nm thick, and less than 15 nm in some examples. In some embodiments, the chunk may be formed through top-down milling into the wafer/IC to form the chunk, which is then removed from the IC, as is known in the art. In other embodiments, planar chunks may be formed and extracted from the wafer/IC. Regardless of how the chunk is formed, the chunk may be a starting sample used to form the lamella. In general, the starting sample may be milled on both sides where the stopping point for milling is based on a feature of interest being centered within the final lamella. The stopping point, or end point, for the milling may be a few nanometers backed off from the feature of interest so as not to damage the feature of interest, and further in an attempt to form the lamella so that only the feature of interest is visible in subsequent TEM images, for example.

Once the chunk is formed, the chunk may be further milled and imaged in sequential steps to determine when a desired end point is reached. As noted, the desired end point may be a stopping place based on a feature present in an image. The feature may signal a stopping point for high beam energy milling or low beam energy milling. The high beam energy milling may be used to remove relatively thick layers from a surface of the chunk, whereas the low beam energy milling may be used to obtain a final desired thickness for the lamella with the feature of interest centered therein. In either instance, the milling, imaging and AI-based image analysis may be performed sequentially until the desired end point is obtained.

After each imaging step, the image may be analyzed by the MLS 114 to determine whether the end point has been reached. The end point, which may be user defined, is based on the location of the feature of interest with respect to the surface of the sample. In some embodiments, the end point may be further based on the milling energy, which may determine how far from the feature of interest the milling should terminate. In some embodiments, the feature of interest may be a source, drain or gate of a specific finFET located within the chunk. In other embodiments, the feature of interest may be circuitry components of a VNAND, DRAM or other memory device. To center the finFET in the final lamella, the milling may remove other finFETs that are located between the surface of the chunk and the feature of interest. As such, part of the analysis performed by the MLS 114 may be to distinguish the finFET of interest from the surrounding finFETs, which may be milled through or adjacent to the finFET of interest within the same plane. Such analysis may require the MLS 114 to keep track of the features imaged and removed while determining if the end point has been reached. See FIG. 4 for an example image sequence and probability determination. In some embodiments, however, the MLS 114 may not keep track of such features, but determine the desired end point based on image analysis at each imaging step instead.

In some embodiments, the images may be analyzed to determine relative position of the face of the lamella to the underlying structure. For example, if the mill face is slightly rotated relative to the features in the chunk, then the amount of rotation may be tracked and corrected for through location specific milling along a face of the chunk/lamella to minimize or eliminate the rotation.

In one or more embodiments, the MLS 114, which may also be referred to as a deep learning system, is a machine-learning computing system. In some embodiments, the MLS 114 is an artificial neural network (ANN) that includes a collection of connected units or nodes, which are called artificial neurons. Each connection transmits a signal from one artificial neuron to another. Artificial neurons may be aggregated into layers. Different layers may perform different kinds of transformations on their inputs. In other embodiments, the machine learning system is a program or system that builds and trains a predictive model from input data based on feature engineering and/or feature vectors to define one or more types of features of interest, e.g. finFET source, drain and gate. For example, every feature of interest e.g. finFET, source, drain, and gate could be defined by different descriptors or vectors and the ones that are more relevant can be selected for use on a given dataset during the training, validation or inference time using feature selection techniques. These feature selection techniques can be part of an existing machine learning algorithm or externally appended.

One type of ANN is a convolutional neural network (CNN). A CNN is conventionally designed to process data that come in the form of multiple arrays, such as a color image composed of three two-dimensional arrays containing pixel intensities in three color channels. Example architecture of a CNN is structured as a series of stages. The first few stages may be composed of two types of layers: convolutional layers and pooling layers. A convolutional layer applies a convolution operation to the input, passing the result to the next layer. The convolution emulates the response of an individual neuron to visual stimuli. A pooling layer combines the outputs of neuron clusters at one layer into a single neuron in the next layer. For example, max pooling uses the maximum value from each of a cluster of neurons at the prior layer. While the discussion may use a CNN as an example ANN, other types of ANN are also contemplated, such as, a regional convolutional neural network, a fully convolutional neural network, and a recurrent neural network.

In one or more embodiments, the MLS 114 is a CNN configured to detect and/or identify, e.g., classify or segment, objects of interest shown in an image of the sample, e.g., chunk or lamella. A feature/structure of interest is a portion of the sample that is imaged, while the remaining portions of the specimen provide context for the feature/structure of interest. However, the feature of interest needs to be determined while the remaining portions of the specimen may be ignored. As an example, a source, gate or drain of a finFET may be the feature of interest within an image, and surrounding finFETs may be ignored or used to ensure the determination of the feature of interest. Of course, the feature of interest disclosed herein are for illustrative purposes only, and any type of feature of interest captured by a CPM system 100 may be classified by the MLS 114.

Prior to use, the MLS 114 may need to be trained to identify desired features of interest within an image. Stated another way, the MLS 114 needs to learn how to segment or classify images as desired based on either predictive analysis (i.e., neural network implementation) or feature vector analysis (i.e., machine learning algorithm implementation). The training may typically include providing the MLS 114 a number of annotated images with the annotations highlighting desired/different components of the structure and further provide weighting/quality indications of each image. For example, boundaries and key reference points may be highlighted. The training images may typically include images of various quality and also include structure of various conformity with desired shape, and potentially be obtained using the imaging platform 108. Based on the training images, the MLS 114 learns how to identify the various classes of any image received regardless of image/structure quality. Further, the amount of training images may be based on the complexity of the structures being analyzed, with less complexity requiring fewer training images.

In some embodiments, the training of the MLS 114 may be a two part process. For example, an initial training data set may be formed from available data and/or samples. In some embodiments, the available data and/samples may be publicly available. In such an example, an available IC may be used for forming images of various finFETs and the surrounding circuitry, e.g., banks of finFETs and connecting electrical traces. The images obtained will be annotated and characterized for weight/quality. The training set may then be used to initially train the MLS 114. A second training set may then be likewise formed but the second training set may use proprietary images obtained and annotated by an end user. The second training set may then be used to update the first training set for retraining the MLS 114, for example. Of course, other possible permutations of this may be implemented. For instance, a training set made only of available data may be used, or, alternatively, a training set of only proprietary images may be used.

Figure 2:
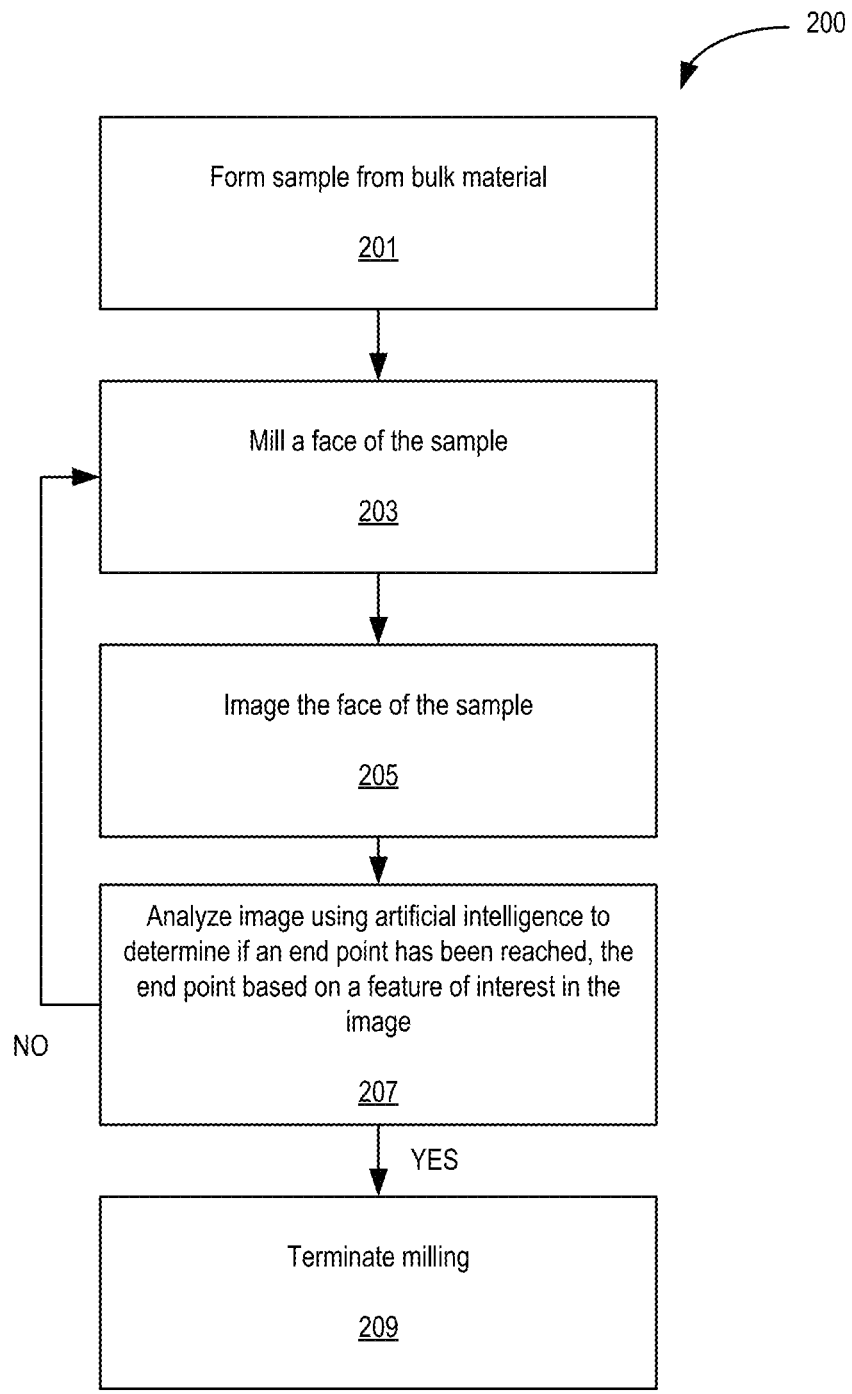
FIG. 2 is an example method for determining a process end point using artificial intelligence in accordance with an embodiment of the present disclosure.

FIG. 2 is an example method 200 for determining a process end point using artificial intelligence in accordance with an embodiment of the present disclosure. The method 200 may be implemented by one or more dual beam systems, e.g., a system including an electron beam and a focused ion beam. For example, the system 100 may implement the method 200. The method 200 may be used to determine an end point to one or more milling process that, for example, may be used to form a lamella. In other embodiments, however, the method 200 may be implemented to determine a stopping point of a process to uncover one or more desired features before proceeding to a subsequent process. In either instance, the method 200 may include an AI-based analysis of one or more images to determine when an end point has been reached. The AI-based analysis may be performed by an ANN, such as ANN 114, or by a machine learning algorithm, both of which may be trained to recognize the desired end point based on analysis of features in charged particle images.

The method 200 may begin with process block 201, which includes forming a sample from bulk material. In this example, the sample may also be referred to as a chunk. A FIB may be used to form the chunk from a wafer, for example. The chunk may include one or more features desired to be analyzed, such as by imaging with a TEM. In some embodiments, the one or more features may be a source, drain, and/or gate of one or more transistors, which may be finFETs in some examples. The chunk may be milled from the sample by forming trenches on both sides of the chunk, then releasing the chunk from the sample by milling between the chunk and the sample on the bottom and sides of the chunk. In some embodiments, the chunk may be the first form of a lamella.

Process block 201 may be followed by process block 203, which includes milling a face of the chunk. After the chunk is formed, the chunk may be further processed, e.g., thinned, to form a lamella having the one or more features of interest centered therein. In some embodiments, the mill of the face of the chunk results in the removal of two to five nanometers of material. Of course, more or less material may be removed during the milling process. In some embodiments, the milling of the face may initially be performed at a high or medium energy level (possibly both) until the end point is obtained, which may then be followed by a low energy mill to "clean" the face of the chunk.

In some embodiments, instead of milling the surface to remove material, material removal may be performed using a laser to ablate or etch material, or a sharp edge, such as a microtome, may be used to remove the material. In general, any form of material removal may be implemented in the method 200 without affecting the end point detection, Process block 203 may be followed by process block 205, which includes imaging the face of the chunk. The face of the chunk may be imaged by a charged particle beam, such as an electron beam or an ion beam. In some embodiments, an SEM image may be formed of the face of the chunk. The image may be obtained so that an end point determination can be made.

Process block 205 may be followed by process block 207, which includes analyzing the image using artificial intelligence to determine if the end point has been reached. The end point, as noted above, may be a location within the chunk/lamella to end a process before performing a subsequent process, or may be the location to end milling so that a feature of interest is centered within the lamella. The AI implemented for the analysis may be an ANN or a machine learning algorithm, such as MLS 114. In some embodiments, the ANN may be a CNN or an RCNN that segments or classifies the images to determine whether the end point has been reached. In other embodiments, a machine learning algorithm performs analysis based on a feature vector to determine whether the end point has been reached. In either embodiment, the end point may be based on features in the image that indicate a location of the face of the chunk/lamella with respect to the feature(s) of interest.

In some embodiments, the process block 207 may further include the placement of a bounding box around the feature of interest. The placement of the bounding box allowing the ANN to determine a size and/or location of the feature of interest within the image.

If the outcome of the analysis is that the end point has not been reached, then the method 200 returns to process block 203 to mill an additional layer off the face of the chunk. On the other hand, if the outcome of the analysis is that the end point has been reached, then the method 200 proceeds to process block 209, which terminates the method 200.

Figure 3:
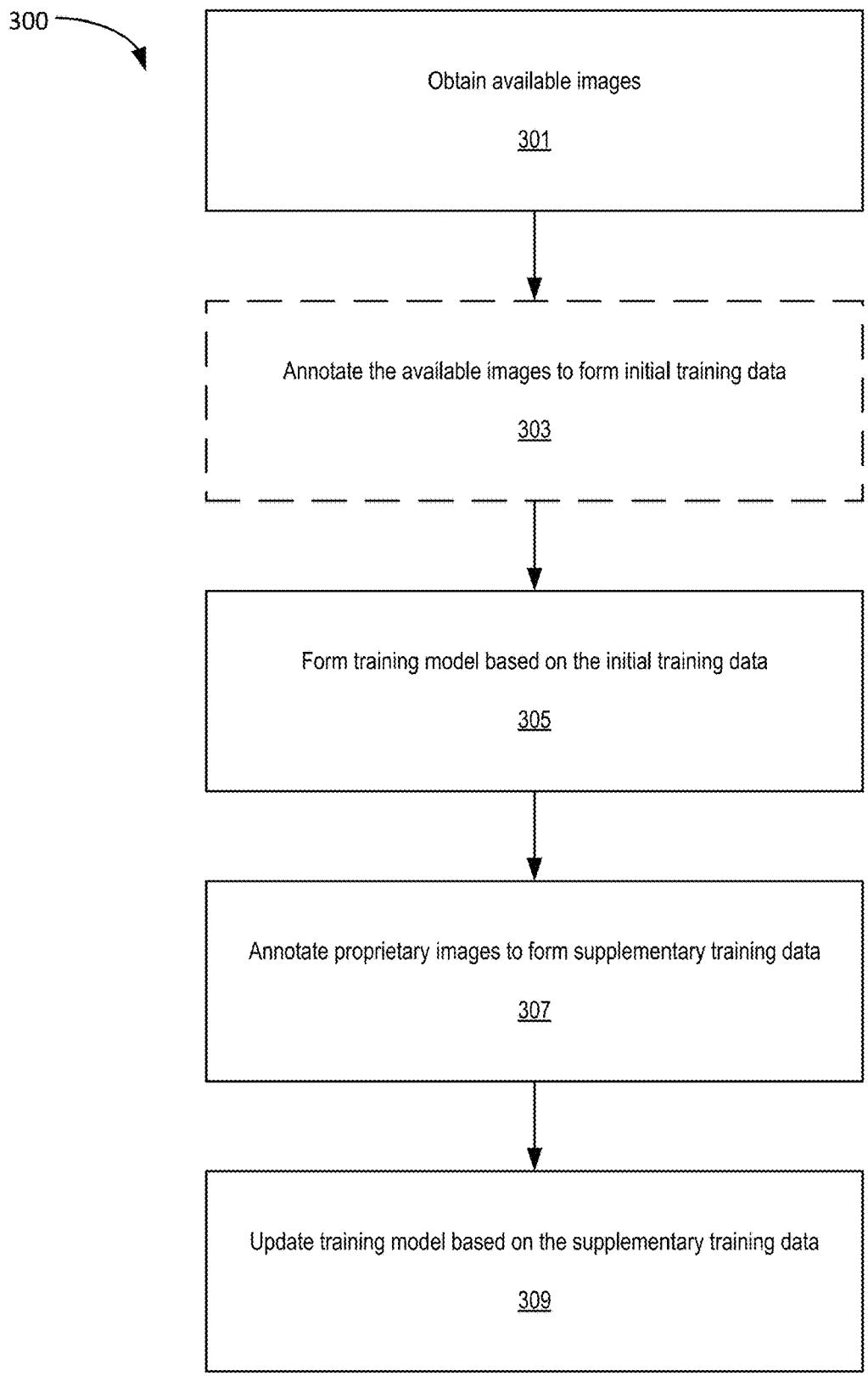
FIG. 3 is an example method for training an artificial neural network used for end point detection in accordance with an embodiment of the present disclosure.

FIG. 3 is an example method 300 for training an artificial neural network used for end point detection in accordance with an embodiment of the present disclosure. The method 300 may be performed by any type of ANN known to those of skill in the art, such as a CNN, RNN, RCNN, or a machine learning algorithm. The method may be performed by a computing system that is not part of a CPM system, but receives images obtained by a CPM system for processing by the method 300. In general, the method 300 may initially train an ANN using available data, then the initially trained ANN may be updated using end user proprietary data.

The method 300 may begin at process block 301, which includes obtaining available images. The available images may be electron micrograph images of electrical circuits similar to those of an end user. For example, the available images may be of finFETs obtained by de-processing integrated circuits and imaging cross-sections of the active circuitry. Additionally, an end user may provide internally obtained images that are no longer considered proprietary. In some embodiments, the obtained images may include a series of cross-sectional images showing the change in features/structures as different portions of a number of circuit elements, e.g., source, drains, gates of transistors, etc., are sequentially imaged.

The process block 301 may be followed by (optional) process block 303, which includes annotate the available images to form initial training data. The annotation may be performed by a skilled technician that can determine features from others and further place a quality or weight score to each annotated image. In some embodiments, a trained neural network may be used to annotate the available images, which may be reviewed by a skilled technician to verify at least some of the neural network annotated images. In other embodiments, annotations may be added to the images using semi-supervised/unsupervised machine learning/clustering algorithms to provide initial annotations which can be reviewed and corrected by the skilled technician. In yet other embodiments, the available images may have already been annotated, which would obviate the need for process block 303. With regards to a machine learning algorithm based analysis, the annotated images may also include information/analysis of the features included in the image, e.g., a feature vector for each image.

The process block 303 may be followed by process block 305, which includes forming a training model based on the initial training data. The training model may be used to train an artificial neural network or a machine learning algorithm used for end point detection as discussed herein.

The process block 305 may be followed by process block 307, which includes annotating proprietary images to form supplementary training data. The annotation of the proprietary images may be performed substantially as is performed in process block 303, e.g., either by a skilled technician, by an artificial neural network, or by a semi-supervised/unsupervised machine learning algorithm. The process block 307 may be followed by process block 309, which includes updating the training model based on the supplementary training data. The updated training model may then be used to retrain the artificial neural network or the machine learning algorithm used for end point detection as discussed herein.

While the method 300 shows that process blocks 307 and 309 are performed after process blocks 301 through 305, the execution of the method 300 need not proceed in such manner. In some embodiments, process block 301 through 305 may be performed substantially in parallel or after process blocks 307 and 309. The end result of the method 300 may be a trained artificial neural network or machine learning algorithm used to detect desired end points such as used to form lamella for semiconductor defect analysis, and which may result in near full automation of such lamella formation processes.

Figure 4:
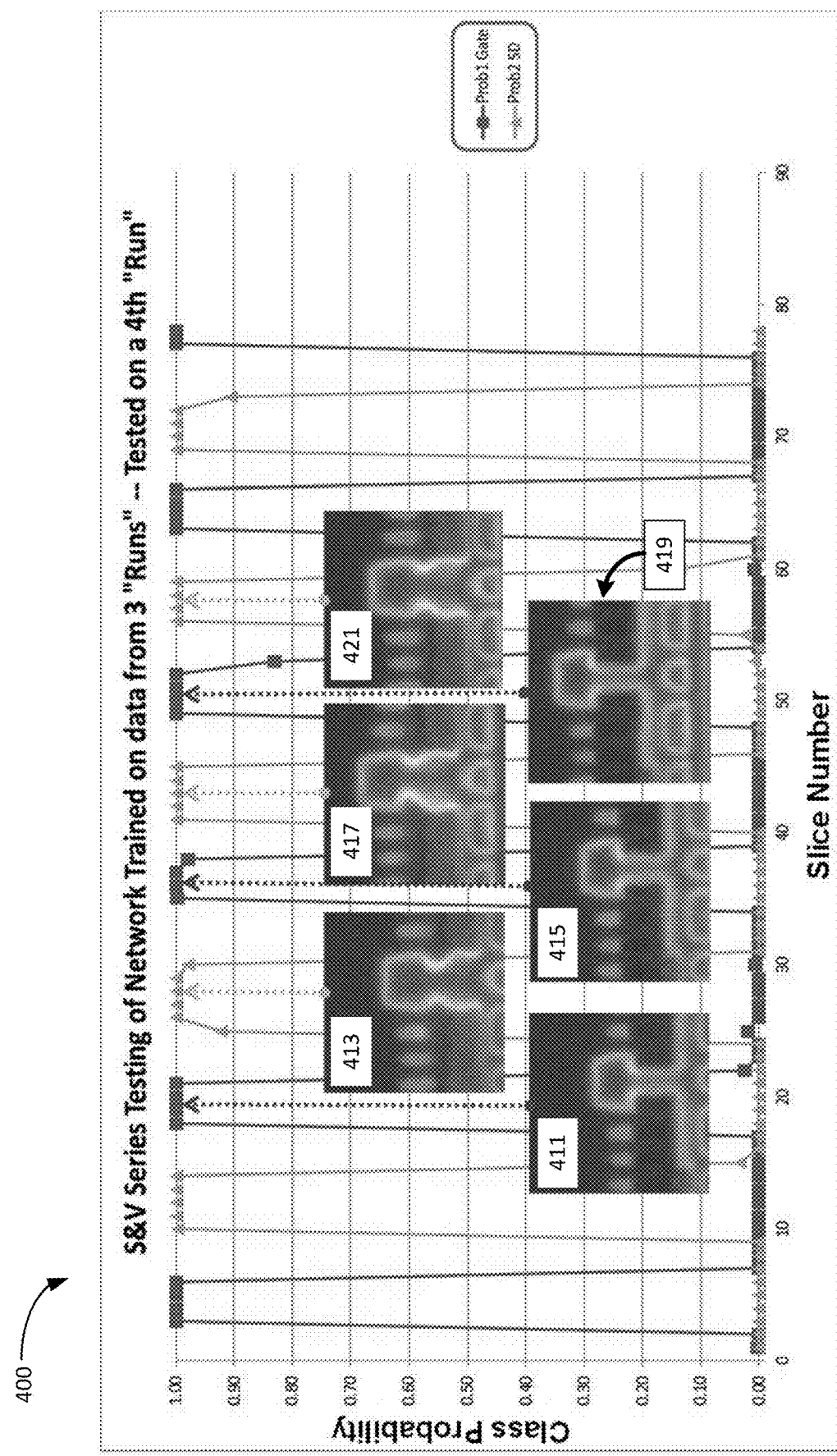
FIG. 4 is an example image sequence including associated ANN analysis of images in accordance with an embodiment disclosed herein.

FIG. 4 is an example image sequence 400 including associated MLS analysis of images in accordance with an embodiment disclosed herein. The image sequence 400 shows locations within a sample and associated class probability as determined by an at least partially trained artificial neural network. The class probability shows determinations of class probabilities for features in images being either a source, drain, or a gate. As indicated in FIG. 4, Prob1 is for a gate determination and Prob2 is for a S/D determination. While FIG. 4 does not include a desired end point, any of the locations and/or images may be a desired end point based on where a point of analysis, e.g., feature of interest, may be located. For example, if a point of analysis includes the feature in image 415, then the processing end point may be a few nanometers before the location of image 415. In some embodiments, the image sequence 400 may also be used as training data.

The graph included in FIG. 4 shows how an ANN's, which may be implemented by MLS 114, analysis determines whether feature within an image is a source, drain or gate based on a classification probability of each image. In this example, the implemented ANN is classifying the images, but in other examples, the images may be segmented by an ANN before determining what feature or features are in the image. In other embodiments, a machine learning algorithm may make the determination based on a feature vector for each feature type, e.g., source, drain and gate. A probability determination is made for each image, where each image is from a different slice of a sample. In this embodiment, each slice is the face or surface of the sample after a milling process is performed, where the milling process removes 2 to 5 nanometers of material. This method of slicing, e.g., milling followed by imaging may also be referred to as a slice and view process where volumes of samples are imaged by removing thin layers to fully uncover the volume. Such a process may be used to generate training images, but may also be used to form lamellas as disclosed herein. However, in terms of lamella formation, a limited number of slice and view steps may be performed before the process is terminated at an identified end point.

As can be seen in the FIG. 4, the class probability, Prob1, for a feature being a gate oscillates opposite of the class probability, Prob2, for a feature being a source or drain. This opposite oscillation may be due to the direction of the slices and images in relation to the physical orientation of the finFETs. For example, the slices are cutting along the ridge of the finFET for FIG. 4, which is shown by the oscillation. While this orientation of finFET to imaging may be desired, in some instances miss-orientation, e.g., rotation of the sample from the imaged face, may be revealed if images include portions of both a S/D and a gate. If this type of miss-orientation is revealed, subsequent milling steps may be modified, e.g., limited to areas of the sample surface, to mitigate the orientation. Further, while only two class probability determinations are shown, other determinations may be made and included in the image sequence 400. For example, a class probability determining whether an image includes a number of fins or an image that is not a gate may also be made.

Image 411, which corresponds to slice 20, was determined by the ANN to have a class probability of 1 for being an image of a gate. As more slices are removed, the Prob1 quickly falls to zero, while Prob2 jumps to 1 for image 413. Image 413, which corresponds to around slice 28, could be the source or drain for the finFET having the gate in image 411, or the S/D features in image 413 could be for a subsequent finFET with the gate of image 415. As noted earlier, keeping track of the sequence of S/D and gate determinations may help determine when the end point has been obtained on top of the image classification performed by the ANN. The classification probability and images continue through image 421 to show how the features change in the image.

According to one embodiment, the techniques described herein are implemented by one or more special-purpose computing devices. The special-purpose computing devices may be hard-wired to perform the techniques, or may include digital electronic devices such as one or more application-specific integrated circuits (ASICs), field programmable gate arrays (FPGAs), visual processing units (VPUs), or network processing units (NPUs) that are persistently programmed to perform the techniques, or may include one or more general purpose hardware processors or graphics processing units (GPUs) programmed to perform the techniques pursuant to program instructions in firmware, memory, other storage, or a combination. Such special-purpose computing devices may also combine custom hard-wired logic, ASICs, FPGAs, or NPUs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 5 is an example functional block diagram of a computer system 500 upon which an embodiment of the invention may be implemented. The computing system 500 may be an example of the computing hardware included with CPM environment 102, such a controller 112, imaging platform 108, sample preparation platform 110, and/or servers 106. Additionally, computer system 500 may be used to implement the one or more neural networks or machine learning algorithms disclosed herein, such as MLS 114. Computer system 500 at least includes a bus 540 or other communication mechanism for communicating information, and a hardware processor 542 coupled with bus 540 for processing information. Hardware processor 542 may be, for example, a general purpose microprocessor. The computing system 500 may be used to implement the methods and techniques disclosed herein, such as methods 301 and 401, and may also be used to obtain images and segment said images with one or more classes.

Computer system 500 also includes a main memory 544, such as a random access memory (RAM) or other dynamic storage device, coupled to bus 540 for storing information and instructions to be executed by processor 542. Main memory 544 also may be used for storing temporary variables or other intermediate information during execution of instructions to be executed by processor 542. Such instructions, when stored in non-transitory storage media accessible to processor 542, render computer system 500 into a special-purpose machine that is customized to perform the operations specified in the instructions.

Computer system 500 further includes a read only memory (ROM) 546 or other static storage device coupled to bus 540 for storing static information and instructions for processor 542. A storage device 548, such as a magnetic disk or optical disk, is provided and coupled to bus 540 for storing information and instructions.

Computer system 500 may be coupled via bus 540 to a display 550, such as a cathode ray tube (CRT), for displaying information to a computer user. An input device 552, including alphanumeric and other keys, is coupled to bus 540 for communicating information and command selections to processor 542. Another type of user input device is cursor control 554, such as a mouse, a trackball, or cursor direction keys for communicating direction information and command selections to processor 542 and for controlling cursor movement on display 550. This input device typically has two degrees of freedom in two axes, a first axis (e.g., x) and a second axis (e.g., y), that allows the device to specify positions in a plane.

Computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor 542 executing one or more sequences of one or more instructions contained in main memory 544. Such instructions may be read into main memory 544 from another storage medium, such as storage device 548. Execution of the sequences of instructions contained in main memory 544 causes processor 542 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 548. Volatile media includes dynamic memory, such as main memory 544. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 540. Transmission media can also take the form of acoustic or light waves, such as those generated during radio-wave and infra-red data communications.

Various forms of media may be involved in carrying one or more sequences of one or more instructions to processor 542 for execution. For example, the instructions may initially be carried on a magnetic disk or solid state drive of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 540. Bus 540 carries the data to main memory 544, from which processor 542 retrieves and executes the instructions. The instructions received by main memory 544 may optionally be stored on storage device 548 either before or after execution by processor 542.

Computer system 500 also includes a communication interface 556 coupled to bus 540. Communication interface 556 provides a two-way data communication coupling to a network link 558 that is connected to a local network 560. For example, communication interface 556 may be an integrated services digital network (ISDN) card, cable modem, satellite modem, or a modem to provide a data communication connection to a corresponding type of telephone line. As another example, communication interface 556 may be a local area network (LAN) card to provide a data communication connection to a compatible LAN. Wireless links may also be implemented. In any such implementation, communication interface 556 sends and receives electrical, electromagnetic or optical signals that carry digital data streams representing various types of information.

Network link 558 typically provides data communication through one or more networks to other data devices. For example, network link 558 may provide a connection through local network 560 to a host computer 562 or to data equipment operated by an Internet Service Provider (ISP) 564. ISP 564 in turn provides data communication services through the world wide packet data communication network now commonly referred to as the "Internet" 566. Local network 560 and Internet 566 both use electrical, electromagnetic or optical signals that carry digital data streams. The signals through the various networks and the signals on network link 558 and through communication interface 556, which carry the digital data to and from computer system 500, are example forms of transmission media.

Computer system 500 can send messages and receive data, including program code, through the network(s), network link 558 and communication interface 556. In the Internet example, a server 568 might transmit a requested code for an application program through Internet 566, ISP 564, local network 560 and communication interface 556.

The received code may be executed by processor 542 as it is received, and/or stored in storage device 548, or other non-volatile storage for later execution.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections. In addition, the values selected may be obtained by numerical or other approximate means and may only be an approximation to the theoretically correct/value.

What is claimed is:

1. A method comprising:
   obtaining, by a charged particle beam, an image of a surface of a sample, the sample including a plurality of features, wherein the plurality of features are circuit structures;
   analyzing, by a machine learning system, the image to determine whether an end point has been reached, the end point based on a feature of interest out of the plurality of features observable in the image; and
   based on the end point not being reached, removing a layer of material from the surface of the sample.

2. The method of claim 1, wherein the machine learning system is an artificial neural network.

3. The method of claim 2, wherein the machine learning system is a convolutional neural network, multi-layer perceptron or a recurrent neural network.

4. The method of claim 2, wherein analyzing, by a machine learning system, the image to determine whether the end point has been reached includes:
segmenting, by the machine learning system, the image to determine the feature of interest from the plurality of features.

5. The method of claim 2, wherein analyzing, by a machine learning system, the image to determine whether the end point has been reached includes:
classifying, by the machine learning system, the plurality of features in the image to determine the feature of interest from the plurality of features.

6. The method of claim 1, wherein analyzing, by a machine learning system, the image to determine whether the end point has been reached includes:
placing a bounding box around the feature of interest to determine a size and location of the feature of interest within the image.

7. The method of claim 1, wherein analyzing, by a machine learning system, the image to determine whether the end point has been reached includes:
analyzing the image by the machine learning system to determine the feature of interest from the plurality of features based on a feature vector.

8. The method of claim 7, wherein the feature vector includes descriptors defining different portions of the feature of interest and one or more descriptors may be selected for use in the feature vector.

9. The method of claim 1, wherein removing a layer of material from the surface of the sample includes:
cutting with a laser, microtome or any other device that removes material.

10. The method of claim 1, wherein removing a layer of material from the surface of the sample includes:
milling, by a focused ion beam, the surface of the sample to remove a layer of material.

11. The method of claim 1, wherein the sample is a lamella.

12. The method of claim 1, wherein the structure included in a semiconductor wafer.

13. A charged particle microscope system for processing samples, the system comprising:
an ion column to provide a focused ion beam;
an electron column to provide an electron beam; and
a controller including code that, when executed, causes the charged particle microscope to:
obtain, by the electron beam, an image of a surface of a sample, the sample including a plurality of features, wherein the plurality of features are circuit structures;
analyze, by a machine learning system, the image to determine whether an end point has been reached, the end point based on a feature of interest out of the plurality of features observable in the image;
based on the end point not being reached, milling, by the focused ion beam, the surface of the sample to remove a layer of material; and
based on the end point being reached, cease material removal.

14. The system of claim 13, wherein the machine learning system is an artificial neural network.

15. The system of claim 14, wherein the artificial neural network is a convolutional neural network, regional convolutional neural network, fully convolutional neural network, multi-layer perceptron or a recurrent neural network.

16. The system of claim 14, wherein the code causing the charged particle microscope to analyze, by the machine learning system, the image to determine whether the end point has been reached further includes code that, when executed, causes the charged particle microscope to:
classify, by the machine learning system, the plurality of features in the image to determine the feature of interest from the plurality of features.

17. The system of claim 14, wherein the code causing the charged particle microscope to analyze, by the machine learning system, the image to determine whether the end point has been reached further includes code that, when executed, causes the charged particle microscope to:
segment, by the machine learning system, the image to determine the feature of interest from the plurality of features.

18. The system of claim 14, wherein the code causing the charged particle microscope to analyze, by the machine learning system, the image to determine whether the end point has been reached further includes code that, when executed, causes the charged particle microscope to:
draw a bounding box around the feature of interest, to show its location and size.

19. The system of claim 13, wherein the code causing the charged particle microscope to analyze, by the machine learning system, the image to determine whether the end point has been reached further includes code that, when executed, causes the charged particle microscope to:
analyze the image by the machine learning algorithm to determine the feature of interest from the plurality of features based on a feature vector.

20. The system of claim 19, wherein the feature vector characterizes the features of interest based on parameters describing the feature of interest.

21. The system of claim 13, wherein the sample is a lamella.

22. The system of claim 13, wherein the circuit structures are included in a semiconductor wafer or semiconductor chip.

* * * * *